United States Patent
Dorfi et al.

(10) Patent No.: US 10,360,325 B2
(45) Date of Patent: Jul. 23, 2019

(54) SYSTEM AND METHOD FOR STEADY STATE SIMULATION OF ROLLING TIRE

(71) Applicant: Bridgestone Americas Tire Operations, LLC, Nashville, TN (US)

(72) Inventors: Hans Dorfi, Akron, OH (US); Russell A. Moser, Louisville, OH (US); Stephen M. Vossberg, Uniontown, OH (US); Thomas R. Branca, Bradford, MA (US)

(73) Assignee: BRIDGESTONE AMERICAS TIRE OPERATIONS, LLC, Nashville, TN (US)

( * ) Notice: Subject to any disclaimer, the term of this patent is extended or adjusted under 35 U.S.C. 154(b) by 982 days.

(21) Appl. No.: 14/391,016

(22) PCT Filed: Mar. 25, 2013

(86) PCT No.: PCT/US2013/033699
§ 371 (c)(1),
(2) Date: Oct. 7, 2014

(87) PCT Pub. No.: WO2013/154820
PCT Pub. Date: Oct. 17, 2013

(65) Prior Publication Data
US 2015/0073756 A1    Mar. 12, 2015

Related U.S. Application Data

(60) Provisional application No. 61/622,726, filed on Apr. 11, 2012.

(51) Int. Cl.
*G06F 17/50* (2006.01)
*G01M 17/02* (2006.01)

(52) U.S. Cl.
CPC ....... *G06F 17/5018* (2013.01); *G01M 17/022* (2013.01)

(58) Field of Classification Search
None
See application file for complete search history.

(56) References Cited

U.S. PATENT DOCUMENTS 4,584,873 A    4/1986 Ongaro
5,375,460 A   12/1994 LaBelle
(Continued)

FOREIGN PATENT DOCUMENTS

EP    1186447        8/2006
EP    1186447 B1    8/2006
(Continued)

OTHER PUBLICATIONS

Byun, Sung Cheal, International Search Report with Written Opinion from PCT/US2013/033699, 11 pp. (dated Jun. 28, 2013).
(Continued)

*Primary Examiner* — Craig C Dorais
(74) *Attorney, Agent, or Firm* — Squire Patton Boggs (US) LLP

(57) ABSTRACT

An apparatus and method are disclosed for modeling at least a portion of a rolling tire (200). A finite element model of at least a portion of a tire (200) rolling against a tire contacting surface (202, 506, 602) is input into a finite element analysis system (100). The system executed instructions that result in the application of a constant force to the model tire (200) or portion thereof by the tire contacting surface (202, 506, 602). The application of force control boundary conditions, as opposed to displacement control, provides significant benefit in terms of computational time of the finite element analysis solution. A finite element analysis simulation of the model against the tire contacting surface (202, 506, 602) is
(Continued)

performed while maintaining the force on the model tire (200). Alternatively, a camber (γ) is also applied to the tire and maintained throughout the simulation.

17 Claims, 11 Drawing Sheets

(56) References Cited

U.S. PATENT DOCUMENTS

| | | |
|---|---|---|
| 5,900,542 A | 5/1999 | Fricke et al. |
| 6,083,268 A | 7/2000 | Kelsey et al. |
| 6,112,586 A | 9/2000 | Fricke et al. |
| 6,430,993 B1 | 8/2002 | Seta |
| 6,549,842 B1 | 4/2003 | Hac et al. |
| 6,754,615 B1 | 6/2004 | Germann et al. |
| 6,781,702 B2 | 8/2004 | Giannakopoulos et al. |
| 7,149,670 B2 | 12/2006 | Iwasaki et al. |
| 7,197,920 B2 | 4/2007 | Friske et al. |
| 7,213,451 B2 | 5/2007 | Zhu et al. |
| 7,308,390 B2 | 12/2007 | Shiraishi |
| 7,343,788 B2 | 3/2008 | Kishida et al. |
| 7,363,805 B2 | 4/2008 | Jayakumar et al. |
| 7,421,890 B2 | 9/2008 | Imanishi et al. |
| 7,434,456 B2 | 10/2008 | Shiraishi |
| 7,680,610 B2 | 3/2010 | Miyashita et al. |
| 7,689,395 B2 | 3/2010 | Namoun |
| 7,778,809 B2 | 8/2010 | Miyahita et al. |
| 7,819,000 B2 | 10/2010 | Iwase |
| 7,885,750 B2 | 2/2011 | Lu |
| 7,908,128 B2 | 3/2011 | Shiraishi |
| 7,908,915 B2 | 3/2011 | Kishida |
| 7,912,683 B2 | 3/2011 | Miyashita |
| 2001/0020386 A1 | 9/2001 | Mancosu et al. |
| 2008/0243446 A1 | 10/2008 | Miyashita |
| 2009/0177346 A1 | 7/2009 | Hac |
| 2009/0228254 A1 | 9/2009 | Seto et al. |
| 2009/0292515 A1 | 11/2009 | Fevrier et al. |
| 2009/0301183 A1 | 12/2009 | Jenniges et al. |
| 2010/0030533 A1 | 2/2010 | Ueda et al. |
| 2010/0211256 A1 | 8/2010 | Takenaka et al. |

FOREIGN PATENT DOCUMENTS

| | | |
|---|---|---|
| EP | 1580673 | 7/2008 |
| EP | 1580673 B1 | 7/2008 |
| EP | 2151775 | 2/2011 |
| EP | 2151775 B1 | 2/2011 |
| JP | 11201875 A | 7/1999 |
| JP | 2006051840 A | 2/2006 |
| JP | 2009020123 A | 1/2009 |
| JP | 2009-161115 | 7/2009 |
| JP | 2009161115 A | 7/2009 |
| JP | 2009-020123 | 9/2009 |

OTHER PUBLICATIONS

Written Opinion of the International Searching Authority and International Preliminary Report on Patentability; Corresponding PCT Application No. PCT/US2013/033699; Authorized Officer Byun, Sung Cheal; dated Oct. 14, 2014.

| Simulation | Spindle | | | | | | Road | | | | | |
|---|---|---|---|---|---|---|---|---|---|---|---|---|
| | Translation | | | Rotation | | | Translation | | | Rotation | | |
| | X | Y | Z | $R_X$ | $R_\omega$ | $R_Z$ | X | Y | Z | $R_X$ | $R_Y$ | $R_Z$ |
| 1 | Fixed | Fixed | Fixed | Fixed | Motion | Fixed | Force | Force | Force | Fixed | Fixed | Fixed |
| 2 | Fixed | Force | Fixed | Fixed | Motion | Fixed | Force | Fixed | Force | Fixed | Fixed | Fixed |
| 3 | Fixed | Fixed | Force | Fixed | Motion | Fixed | Force | Fixed | Fixed | Fixed | Fixed | Fixed |
| 4 | Fixed | Force | Force | Fixed | Motion | Fixed | Force | Fixed | Fixed | Fixed | Fixed | Fixed |
| 5 | Force | Force | Force | Fixed | Motion | Fixed | Fixed | Fixed | Fixed | Fixed | Fixed | Fixed |
| 6 | Force | Fixed | Force | Fixed | Motion | Fixed | Fixed | Force | Fixed | Fixed | Fixed | Fixed |
| 7 | Force | Force | Fixed | Fixed | Motion | Fixed | Fixed | Fixed | Force | Fixed | Fixed | Fixed |
| 8 | Force | Fixed | Fixed | Fixed | Motion | Fixed | Fixed | Force | Force | Fixed | Fixed | Fixed |
| 9 | Fixed | Fixed | Fixed | Fixed | Torque | Fixed | Motion | Force | Force | Fixed | Fixed | Fixed |
| 10 | Fixed | Force | Fixed | Fixed | Torque | Fixed | Motion | Fixed | Force | Fixed | Fixed | Fixed |
| 11 | Fixed | Fixed | Force | Fixed | Torque | Fixed | Motion | Force | Fixed | Fixed | Fixed | Fixed |
| 12 | Fixed | Force | Force | Fixed | Torque | Fixed | Motion | Fixed | Fixed | Fixed | Fixed | Fixed |
| 13 | Motion | Force | Force | Fixed | Torque | Fixed | Fixed | Fixed | Fixed | Fixed | Fixed | Fixed |
| 14 | Motion | Force | Fixed | Fixed | Torque | Fixed | Fixed | Fixed | Force | Fixed | Fixed | Fixed |
| 15 | Motion | Fixed | Force | Fixed | Torque | Fixed | Fixed | Force | Fixed | Fixed | Fixed | Fixed |
| 16 | Motion | Fixed | Fixed | Fixed | Torque | Fixed | Fixed | Force | Force | Fixed | Fixed | Fixed |

FIG. 7

| Simulation | Spindle | | | | | | Drum | | | | | |
|---|---|---|---|---|---|---|---|---|---|---|---|---|
| | Translation | | | Rotation | | | Translation | | | Rotation | | |
| | X | Y | Z | Rx | Rω | Rz | X | Y | Z | Rx | Ry | Rz |
| 17 | Fixed | Fixed | Fixed | Fixed | Motion | Fixed | Fixed | Force | Force | Fixed | Torque | Fixed |
| 18 | Fixed | Force | Fixed | Fixed | Motion | Fixed | Fixed | Fixed | Force | Fixed | Torque | Fixed |
| 19 | Fixed | Fixed | Force | Fixed | Motion | Fixed | Fixed | Force | Fixed | Fixed | Torque | Fixed |
| 20 | Fixed | Force | Force | Fixed | Motion | Fixed | Fixed | Fixed | Fixed | Fixed | Torque | Fixed |
| 21 | Force | Force | Force | Fixed | Motion | Fixed | Fixed | Fixed | Fixed | Fixed | Fixed | Fixed |
| 22 | Force | Fixed | Force | Fixed | Motion | Fixed | Fixed | Fixed | Force | Fixed | Fixed | Fixed |
| 23 | Force | Force | Fixed | Fixed | Motion | Fixed | Fixed | Force | Fixed | Fixed | Fixed | Fixed |
| 24 | Force | Fixed | Fixed | Fixed | Motion | Fixed | Fixed | Force | Force | Fixed | Fixed | Fixed |
| 25 | Fixed | Fixed | Fixed | Fixed | Torque | Fixed | Fixed | Force | Force | Fixed | Motion | Fixed |
| 26 | Fixed | Force | Fixed | Fixed | Torque | Fixed | Fixed | Fixed | Force | Fixed | Motion | Fixed |
| 27 | Fixed | Fixed | Force | Fixed | Torque | Fixed | Fixed | Force | Fixed | Fixed | Motion | Fixed |
| 28 | Fixed | Force | Force | Fixed | Torque | Fixed | Fixed | Fixed | Fixed | Fixed | Motion | Fixed |
| 29 | Motion | Force | Force | Fixed | Torque | Fixed | Fixed | Fixed | Fixed | Fixed | Fixed | Fixed |
| 30 | Motion | Force | Fixed | Fixed | Torque | Fixed | Fixed | Fixed | Force | Fixed | Fixed | Fixed |
| 31 | Motion | Fixed | Force | Fixed | Torque | Fixed | Fixed | Force | Fixed | Fixed | Fixed | Fixed |
| 32 | Motion | Fixed | Fixed | Fixed | Torque | Fixed | Fixed | Force | Force | Fixed | Fixed | Fixed |

FIG. 8

SYSTEM AND METHOD FOR STEADY STATE SIMULATION OF ROLLING TIRE

FIELD OF INVENTION

This disclosure relates to computer modeling of rolling tires, including through finite element analysis.

BACKGROUND

The computational resources required to perform finite element analyses of tires are significant. Simulation of a rolling tire on a road surface is particularly costly in terms of the computational resources required to perform such a simulation.

SUMMARY

An apparatus and method are disclosed for modeling a rolling tire. A finite element model of at least a portion of a tire rolling against a road surface is input into a finite element analysis system. The system executes instructions that result in the application of a constant force between the tire or portion thereof and the road surface. A finite element analysis simulation of the model against the road surface is performed while maintaining the force on the tire. Alternatively, a camber is also applied to the tire and maintained throughout the simulation.

BRIEF DESCRIPTION OF THE DRAWINGS

In the accompanying drawings, structures and methods are illustrated that, together with the detailed description provided below, describe exemplary embodiments of systems and methods for simulating a steady state rolling tire. One of ordinary skill in the art will appreciate that a single component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

FIG. 2A illustrates a model of a rolling tire 200 having a partial tread against a road surface 202 generated by FEA system 100.

FIG. 7 illustrates a table identifying simulations having varying constraints on a tire 200 modeled on a flat road surface 202.

FIG. 8 illustrates a table identifying simulations having varying constraints on a tire 200 modeled on a drum 600.

DETAILED DESCRIPTION

Figure 1:
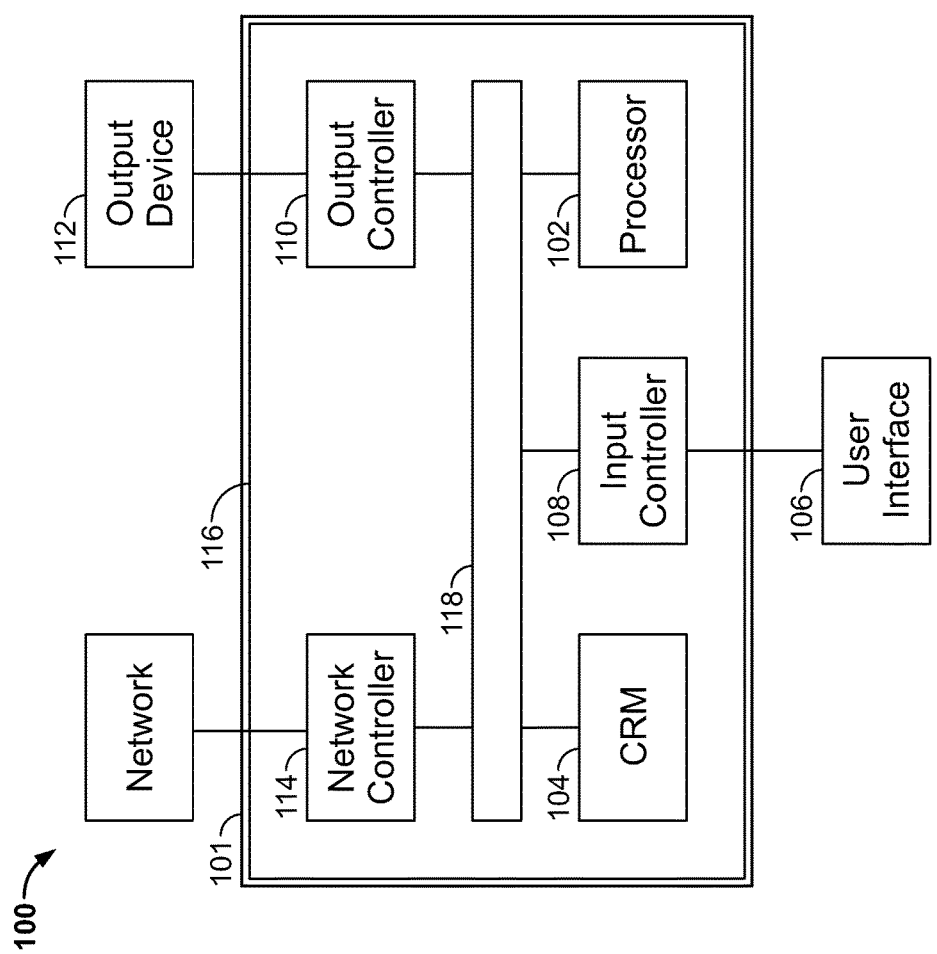
FIG. 1 illustrates a block diagram of an exemplary finite element analysis (FEA) processing system 100.

FIG. 1 illustrates a block diagram of an exemplary finite element analysis (FEA) processing system 100. FEA processing system 100 may include a computing device 101 housing a processor 102 and computer readable medium 104. A user interface 106, such as a keyboard, mouse or other such device is connected to an input controller 108, allowing the user to interact with FEA system 100, including with processor 102 and computer readable medium 104. Output controller 110 may receive information from input controller 108, processor 102 and/or computer readable medium 104 for presentation to the user through output device 112, which may take the form of a video monitor or printer, for example. Computer readable medium 104 may take the form of a hard disk drive, solid state hard drive or read only memory ("RAM"), for example, and may supply information to any of the components of FEA processing system 100. A network controller 114 allows FEA system 100 to communicate with a network, such as the internet or company intranet. One or more of user input controller 108, output controller 110 and network controller may be integrated into processor 102. The components of FEA system 100, such as processor 102 and computer readable medium 104, may be secured to a motherboard 116, which provides connections among the various components, for example through bus 118.

In a preferred embodiment, FEA system 100 performs the methods disclosed herein through use of an FEA software package installed upon the computer readable medium 104 having instructions that can be executed by processor 102. When executed by processor 102, the FEA software package is configured to receive an FEA model of a tire and perform an FEA analysis of the tire model. An FEA model may incorporate a variety of aspects of a tire, such as tread design, tire size, tire shape, material properties of the tread and underlying structures, such as belt plies, and inflation level. As used herein, the term "tread" refers to that portion of the tire that comes into contact with the road under normal load. The FEA model may be introduced to the FEA system 100 by the user through user interface 106, or by selection and retrieval of a previously composed model stored on computer readable medium 104 or on a storage device accessible though the network. Processor 102 generates results of the FEA analysis in the form of data that is written to and stored on the computer readable medium 104. The data generated by the FEA analysis may, for example, be displayed on output device 112, or may be processed further.

Figure 2:
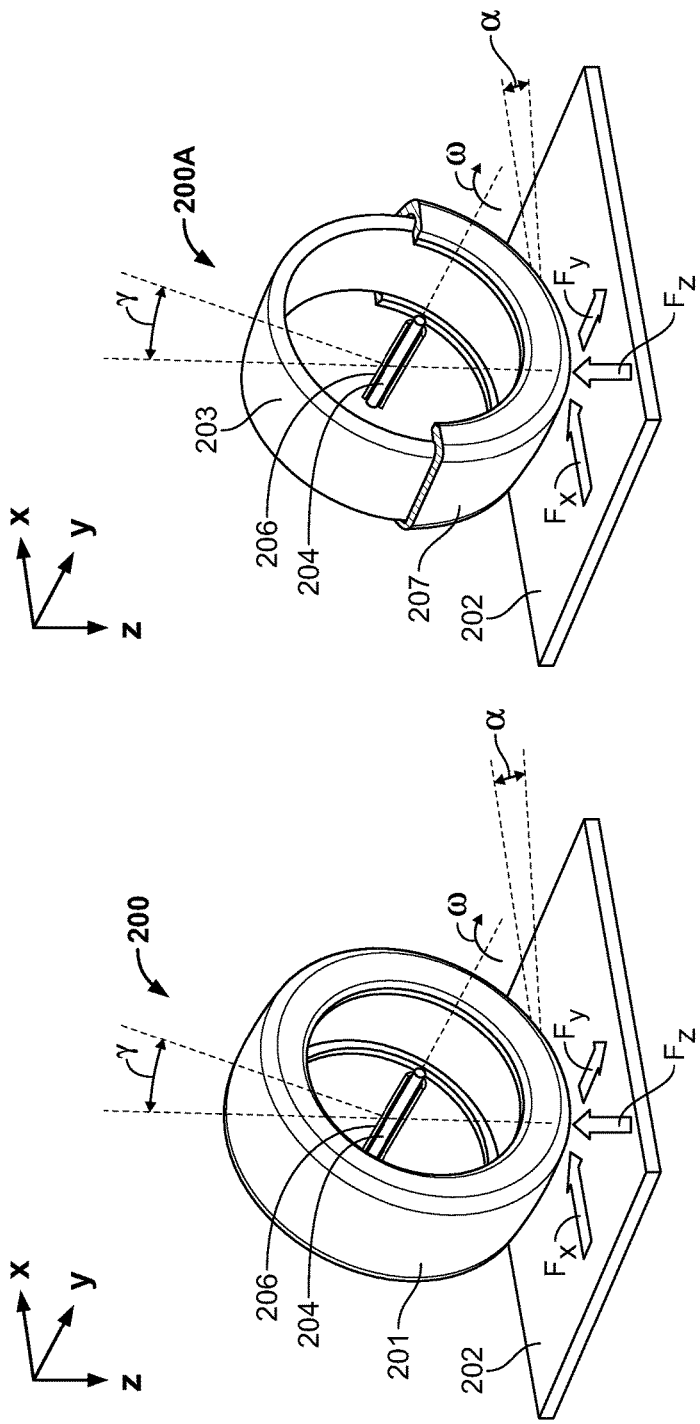
FIG. 2 illustrates a model of a rolling tire 200 against and road surface 202 generated by FEA system 100.

FIG. 2 illustrates a model tire 200 in contact against a planar road surface 202 simulated by FEA system 100. It should be noted that while FIG. 2 illustrates a model of a complete tire, a tire with only a portion of a tire tread may also be used. As shown in FIG. 2A, the tire model 200A has a full carcass 203 and is made up of a portion of the tire tread 207 extending about 160 degrees circumferentially around the tire. Use of a model having only a portion of tread instead of a model having a complete tire and tread pattern reduces the computational requirements to perform the simulation as FEA system 100 will have a reduced numbers of nodes corresponding to the tread for which it must obtain solutions relative to a tire model having a complete tread. In other aspects of the present disclosure, the circumferential tread may extend less than or more than about 160 degrees around the tire carcass 203. Tread portions having circumferential angular lengths from between about 90 degrees to 270 degrees may be used, for example. The lower bound may be selected so that the tire model 200 has sufficient circumferential length to achieve a rolling steady state, and so may be less than 60 degrees as long as a steady state may be achieved. In addition, tread pattern models with a circumferential length of greater than 180 degrees may be used, up to a complete tire, however such lengths may provide less reduction in the computing resources required to perform the simulation without a corresponding benefit in the accuracy of modeling dependent variables.

Spindle 204 rotates with tire 200 as if rigidly connected to tire 200 through a wheel on which tire 200 is mounted. Spindle 204 sits within spindle carrier 206 and rotates within carrier 206. In one aspect of the present teachings, the positive X axis is aligned with the equatorial plane of the tire and parallel to the road surface, for example as can be determined by projection of the equatorial plane of the tire onto road surface 202. As used herein, the term "equatorial plane" refers to the plane that is perpendicular to the tire's axis of rotation and disposed such that it would pass through the center of the omitted wheel. The positive Z axis is perpendicular to the plane of the road surface 202 and points downward into the road surface 202. The positive Y axis is perpendicular to the X and Z axes and points in a direction such that the Cartesian coordinate system defined by the X, Y and Z axes adheres to the right-handed convention. In the preferred embodiment, the road surface 202 may translate along the direction of the X and Y axes, but does not rotate about the X and Y axes. While a Cartesian coordinate system such as the one above is exemplary, other three-dimensional coordinate systems may be used, such as cylindrical or spherical coordinate systems. Coordinates in such systems may be alternatively expressed in the XYZ coordinate system discussed above, for example by applying a linear transformation to the coordinates expressed in a selected coordinate system to obtain coordinates in the XYZ coordinate system. While the teachings herein refer to the XYZ coordinate system described above for convenience, the teachings herein are also applicable without limitation to any suitable three-dimensional coordinate system.

In the simulation performed by FEA system 100, forces $F_x$, $F_y$ and $F_z$ are the forces applied by road surface 202 on tire 200 along the X, Y and Z axes, respectively. As shown in FIG. 2 the longitudinal force $F_x$ points in the positive X direction and lateral force $F_y$ points in the positive Y direction. It will be noted that forces in negative directions are permitted without limitation. $F_z$ represents the normal force applied by road surface 202 on tire 200 and is shown in the negative Z direction. Modeled tire 200 spins at an angular velocity of $\omega$, and has a camber angle denoted $\gamma$ relative to the Z axis. The slip angle, denoted $\alpha$, corresponds to the angle measured in the X-Y plane between the direction of travel of the road surface and the direction the tire is oriented, the latter of which is parallel to the intersection of the equatorial plane E of the tire and the road surface 202. The force and camber described above can be set through an FEA software package installed upon the computer readable medium 104 of FEA system 100.

Figure 3:
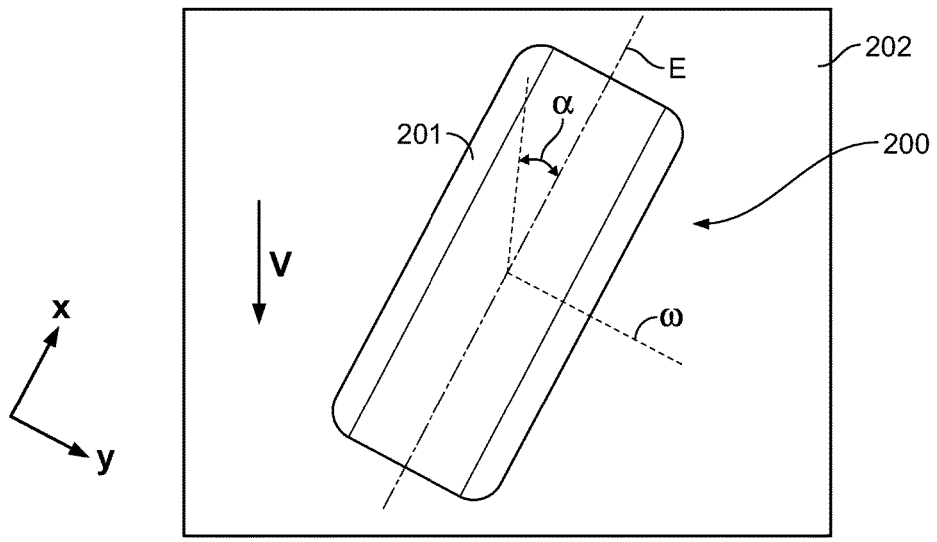
FIG. 3 illustrates an isometric view of the model tire 200 shown in FIG. 2.
Figure 4:
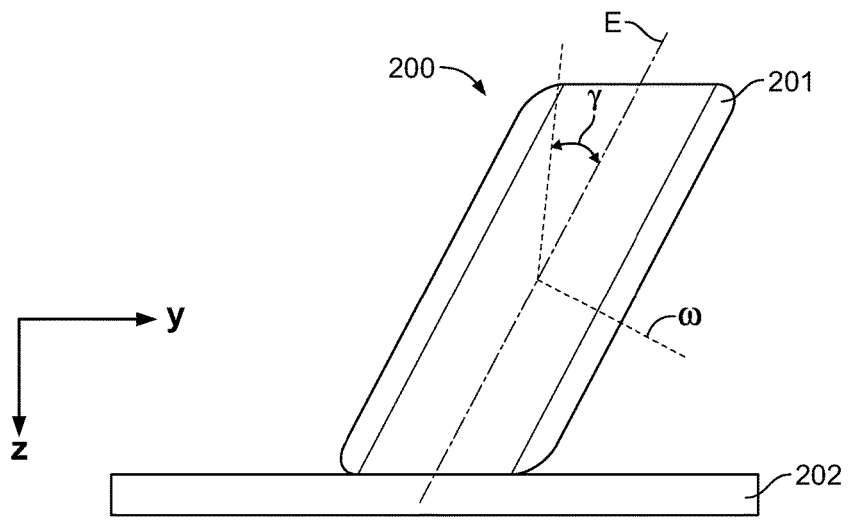
FIG. 4 illustrates another isometric view of the model tire 200 shown in FIG. 2.

FIG. 3 shows an isometric view along the positive Z direction of a model tire 200 against a road surface 202. For ease of reference, the camber angle $\gamma$ is zero in FIG. 2. The direction of travel of the road is along the vector V. The slip angle $\alpha$ is shown as the angle between the intersection of the equatorial plane E of the wheel with the road surface 202 and the direction of travel of the road 202. FIG. 4 shows another isometric view of the model tire 200, this time as viewed along the positive X direction. As shown in FIG. 4, the camber angle $\gamma$ corresponds to the angle measured in the Y-Z plane between the Z axis and the equatorial plane E. For ease of reference, the slip angle $\alpha$ is zero in FIG. 3.

Figure 5:
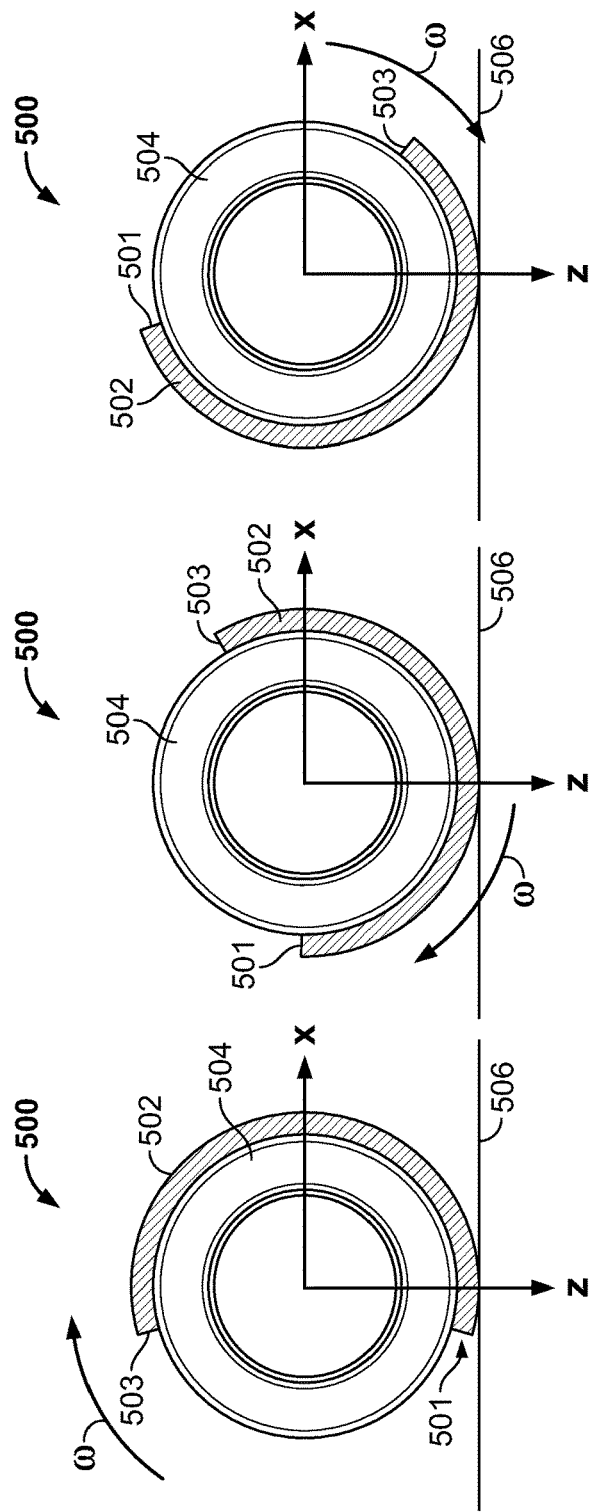
FIGS. 5A-5C illustrate a side view of a tire model 500 during an FEA simulation.

FIGS. 5A through 5C illustrate a tire model 500 at various stages of a simulation. The tire model 500 illustrated in FIGS. 5A through 5C has a partial tread 502 wrapped around a carcass 504. The tire rolls against road surface 506. The simulation starts as shown in FIG. 5A with one end 501 of the partial tread proximate to the region where the tread 502 is in contact with the road surface 506. As the simulation progresses, the tire model 500 rotates with an angular velocity $\omega$ and the partial tread 502 rotates with the carcass 504. As illustrated in FIG. 5C, the model 500 rotates until a second end 503 of the partial tread 502 reaches the region where the tread 502 is in contact with the road surface 506.

Figure 6:
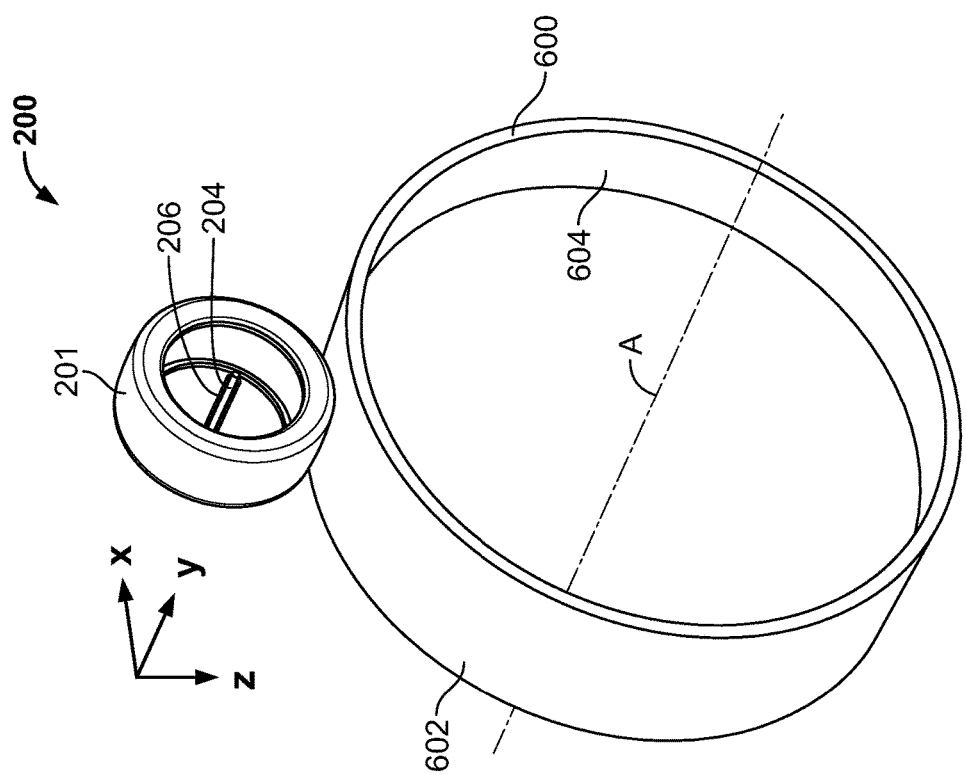
FIG. 6 illustrates a simulation of a tire model 200 rolling on a drum 600.

FIG. 6 illustrates another aspect of the present teachings. The model tire 200 shown in FIG. 6 rolls against a drum 600 having an outer cylindrical contact surface 602 serving as a road surface against which the tire 200 rolls. According to one aspect of the present teachings, forces may be applied to tire model 200 by the drum 600 during an FEA simulation. For example, forces in the X, Y and Z directions, $F_x$, $F_y$ and $F_z$, may be applied to the tire through the drum. In another aspect of the present teachings, a torque may be applied to the drum 600, causing rotational motion of the drum 600 and thereby permitting simulation of the tire 200 rotating on the rotating drum 600. Such a configuration allows tire model 200 to rotate while in a stationary position and while the drum 600 rotates about axis A. According to yet another aspect of the present disclosure, the tire model 200 may also rotate on the inner cylindrical contact surface 604. Drum 600 may also be implemented in simulations involving a tire model 200A having a partial tread 207, such as that shown in FIG. 2A.

FIG. 7 illustrates a table listing simulations having varying arrangements of force, torque or motion constraints on linear and rotational motion parameters of a tire modeled on a flat road surface, for example as shown in FIGS. 2 and 2A. According to one aspect of the present teachings, parameters describing the motion of the spindle 204, and by extension the tire 200, and road surface 202 in the simulations are shown in FIG. 7. The degrees of freedom related to the spindle 204 are translational motion of the spindle 204 in each of the X, Y and Z directions, and rotational motion of the spindle 204 about the X, Z and $\omega$ directions, denoted $R_X$, $R_Z$ and $R\omega$, where $\omega$ is parallel to the axis of rotation of the model tire 200, and thereby parallel to the longitudinal axis of spindle 204. The degrees of freedom of the road surface 202 are translational motion of the road 202 of the in each of the X, Y and Z directions, and rotational motion of the road about the X, Y and Z directions, denoted $R_X$, $R_Y$ and $R_Z$.

The entry "fixed" in a particular column indicates that, for the corresponding simulation, the translational or rotational motion of the spindle 204 or road 202 is fixed for the parameter corresponding to the column. For example, in simulations 1 through 4, the translation of the spindle 204 in the X direction is fixed. Thus, in those simulations, the tire 200 is stationary in the X direction. In addition, the rotational motion of the spindle 204 about the X direction and Z direction is indicated as fixed, and thus in these simulations the tire spindle 204 does not rotate about the X direction or Z direction.

The entry "force" in FIG. 7 indicates that a fixed force is applied in the indicated translational direction. For example, in simulation 2 a constant force in the Y direction is applied through the spindle 204, resulting in the tire 200 applying a force onto the road surface 202 in the Y direction. Also in simulation 2, a constant force in the Z direction and X direction is applied by the road surface 202 onto the tire 200.

In addition to forces in the X, Y and Z directions, torques may be applied to the spindle 204. The entry "torque" in FIG. 7 denotes that a torque is applied in the indicated rotational direction. In one aspect of the present teachings, an entry of "torque" in the $R_X$ column denotes torque applied about the X axis, an entry in the $R_Z$ column denotes a torque applied about the Z axis and an entry in the Rω column denotes torque applied to the spindle about the axis of rotation ω. In another aspect of the present teachings, torques are applied to the spindle 204 about the axis of rotation ω for each of the simulations 9 though 16.

The entry "motion" in a particular column in FIG. 7 denotes motion is imposed on the particular degree of freedom of the spindle 204 or road 202 by the motion, force and/or torque constraints applied in the particular simulation. In one aspect of the present teachings, the entry of motion in the column corresponding to spindle 204 rotation Rω and the row corresponding to simulation 1 indicates that the spindle 204 rotates about axis of rotation ω under an imposed motion while motion, force and torque constraints are applied to the remaining degrees of freedom of simulation 1.

With continued reference to FIG. 7, the tire model 200 is stationary in the X direction in simulations 1 through 4. Translation of the spindle 204 in the X direction is fixed in each of simulations 1 through 4, and a force is applied by the road 202 onto the tire 200 in the X direction. In one aspect of the present teachings, all of the forces in a simulation are applied to the tire model 200 through the road surface 202, as with simulation 1. In other aspects, one or both of forces in the Y-direction and Z-direction may be applied through the spindle 204 instead of through the road surface 202, for example as shown in simulations 2 through 4. In each of simulations 1 through 4, the rotation of the spindle 204 is limited to rotation about axis of rotation ω, with no rotation about the X or Z directions. In another aspect of the present teachings, the road surface 202 is limited to translational motion, and does not rotate in any of the simulations 1-16. This is indicated by entry of the "fixed" rotational constraint in the columns $R_X$, $R_Y$ and $R_Z$, which correspond to the rotational motion of the road 202, for each of simulations 1-16.

In simulations 5 through 8, the tire 200 is rolling forward in the X direction. In each of simulations 5 through 8, a force is applied to the spindle 204 in the X direction, and the road surface 202 is held fixed in the X direction. In one aspect of the present teachings, all of the forces in a simulation are applied to the tire model 200 through the road surface 202, as with simulation 1. In another aspect of the present teachings, all of the forces in a simulation are applied to the tire model 200 through the spindle 204, as with simulation 4. In yet other aspects, one or both of forces in the Y direction and Z direction may be applied through the road surface 202 instead of through the spindle 204, for example as applied in simulations 6 through 8.

The tire model 200 is stationary in the X direction in simulations 9 through 12, as indicated by the entry of "fixed" corresponding to translation of the spindle 204 in the X direction. A torque is applied through the spindle 204 about the axis of rotation ω, while rotation of the spindle 204 about the X and Z axes are fixed. The forces in the Y and Z directions may be applied entirely through the road surface 202, as in simulation 9, entirely though the spindle 204 as in simulation 12, or through a combination of the road 202 and spindle 204 as indicated for simulations 10 and 11. In simulations 13 through 16, the tire model 200 is rolling forward in the X direction. In each of simulations 13 through 16, a torque is applied to the spindle 204 about the axis of rotation ω, and the road surface 202 is held fixed in the X direction, imparting a rolling motion on the spindle 204 and tire model 200, thereby moving the tire model 200 forward in the X direction. In one aspect of the present teachings, one or both of forces in the Y and Z directions may be applied either through the road surface 202 or the spindle 204, for example as shown in the case of simulations 13 through 16.

FIG. 8 illustrates examples of simulations according to the present teachings performed on a tire 200 modeled on a drum 600 as shown in FIG. 6. The simulations listed in FIG. 8 are described by constraints placed on the spindle 204 and the drum 600, which applies force to the tire model 200 through either the outer contact surface 602 or inner contact surface 604. The degrees of freedom of the spindle 204 are described above with reference to FIG. 7, and in particular, the entries in the table shown in FIG. 8 concerning the translational and rotational motion of the spindle 204 in simulations 17 through 32 track those of simulations 1 through 16 in FIG. 7.

With regard to simulations 17-20, a torque is applied to the drum 600 about the $R_Y$ direction, while, as with the remaining simulations 21-32, the drum is fixed with respect to rotation about the $R_X$ and $R_Z$ directions. In addition, as with each of the simulations 17 through 32, the drum 600 is fixed with respect to translation in the X direction. As a result of these constraints, the tire model 200 remains stationary as it rolls on a drum 600 in simulations 17-20.

In simulations 21 through 24, the tire 200 is simulated rolling in the X direction, which corresponds to the tire 200 rolling around the drum 600. In these simulations, no torque is applied to the drum 600 about any of the X, Y or Z axes and a force along the X direction is applied to the spindle 204. In simulations 25 through 28, the tire model 200 rolls while stationary. In these simulations, the drum 600 is permitted to have rotational motion about the Y axis, and a torque is applied at the spindle 204 about the axis of rotation ω. In simulations 29 through 32, the tire 200 is simulated rolling in the X direction as torque is applied to the spindle 204 about the axis of rotation ω and no torque is applied to the drum 600. In each of the simulations shown in FIG. 8, force in the Y or Z directions can be placed on the tire 200 through one of the spindle 204 and drum 600. For example, in simulation 17, forces in the Y and Z directions are placed on the tire 200 through the drum 600 only, while in simulation 20 forces in the Y and Z directions are placed on the tire model 200 through the spindle 204 only. In simulations 18 and 19, forces in the Y and Z directions are applied separately by one or the other of the spindle or drum.

In each of the simulations shown in FIGS. 7 and 8, the constraints placed on the model are such that the interface forces (Fx, Fy, and Fz) between the tire and contact surface are constant. In one aspect of the present teachings, the interface forces are held constant throughout the simulation.

Figure 9:
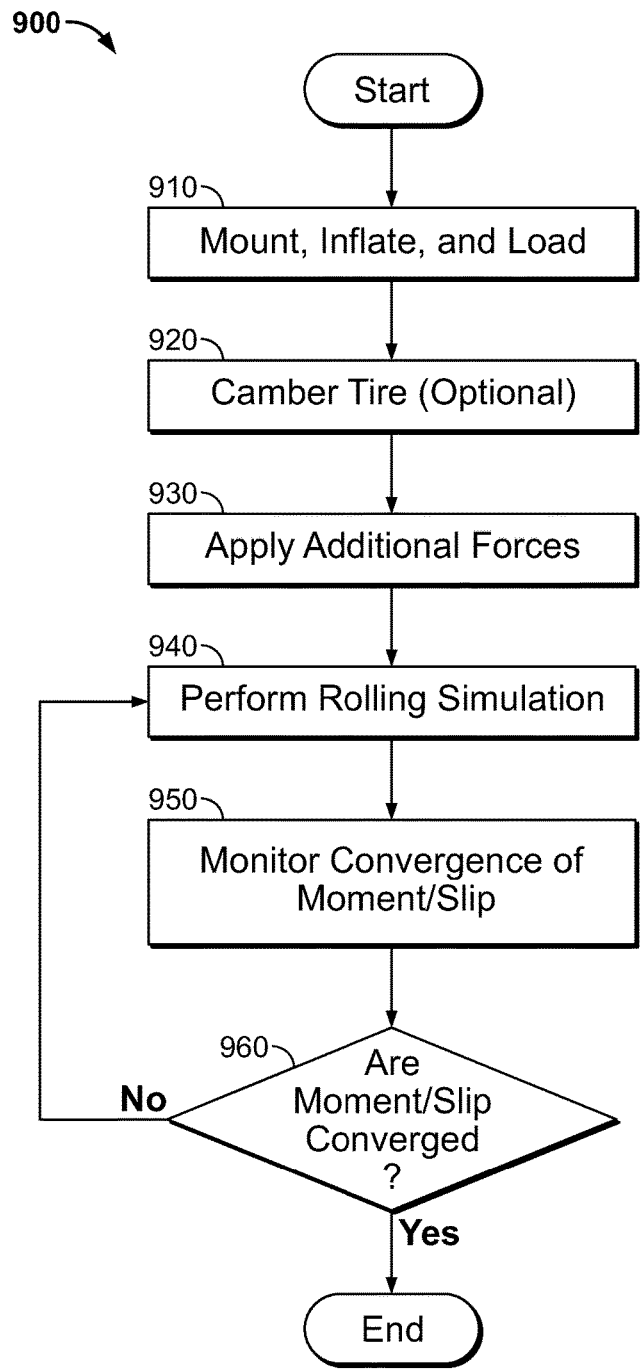
FIG. 9 illustrates a method of modeling a rolling tire 200 having at least a portion of a tread.

FIG. 9 illustrates an exemplary method 900 that may be performed by FEA system 100 to perform a simulation on tire 200. According to the present disclosure, at step 910, a finite element model of a tire 200 is mounted to a rim, inflated, and a load is applied to the tire through the contact surface such as a road surface 202 as shown in FIGS. 2 and 2A, or a drum 600 such as shown in FIG. 6. The loading performed in step 910 includes applying a force in a direction normal to the contact surface. The model 200 may incorporate a variety of aspects of a tire, such as tread design, tire size and shape. The FEA model may be introduced to the FEA system 100 by the user's interaction with the FEA software package through user interface 106, or by selection and retrieval of a previously created model stored on computer readable medium 104. In step 920, an optional camber angle γ may be applied to tire 200. Note that the camber referenced in step 920 may alternatively be introduced before, after or during step 910.

In step 930, additional forces or torques are applied to the tire model 200. Such forces or torques may be applied through the spindle 204, or through the road surface 202 or through drum 600. In one aspect of the present teachings, the forces applied in step 930 are in the X-Y plane and may be limited to align with only one of the X or Y axes. Alternatively, the force applied may be a generalized force with components along both the X and Y axes. In one aspect of the present teachings, the loading force and contact forces applied in steps 910 and 930 are held constant throughout the simulation by FEA system 100. Modeled tire 200 will experience deformation as a result of the various forces $F_x$, $F_y$ and $F_z$ applied in step 930.

In step 940, FEA system 100 begins performing a rolling tire FEA simulation on the model, for example through processor 102 executing the instructions contained within an FEA software package stored on computer readable medium 104. In one aspect of the present teachings, the camber referenced in step 920 and forces referenced in step 910 and 930 are introduced prior to starting the rolling simulation of tire 200. In one aspect of the present disclosure, a fixed value for the rotational velocity ω is applied to the model 200 as an independent variable measured at spindle 204 and the road 202 velocity is determined by the rolling process. In an alternative embodiment, instead of applying a constraint rendering rotational velocity constant, a constant forward velocity is applied to the road surface 202 or drum 600 and the rotational velocity is determined at the spindle 204.

At step 950, FEA system 100 monitors the convergence of dependent parameters such as the moment of the tire, and slip angle. FEA system 100 iteratively solves the tire conditions at each incremental time interval of the simulation while continuing to apply the force parameters introduced at step 910 and 930, and if applicable, the camber angle γ parameter introduced in step 920, through the simulation. In the preferred embodiment, the values of the forces applied to the tire by the road surface, and any camber, are maintained at a constant value throughout the simulation.

At step 960, FEA system determines whether selected dependent variables have converged to steady-state values. As discussed further herein, the conditions under which the simulation is considered to have converged can vary and may be selected by a user of FEA system 100. If the FEA system determines the conditions for convergence have been met, then the simulation is ended, whereas if the conditions have not been reached, the simulation continues with step 940.

Figure 10:
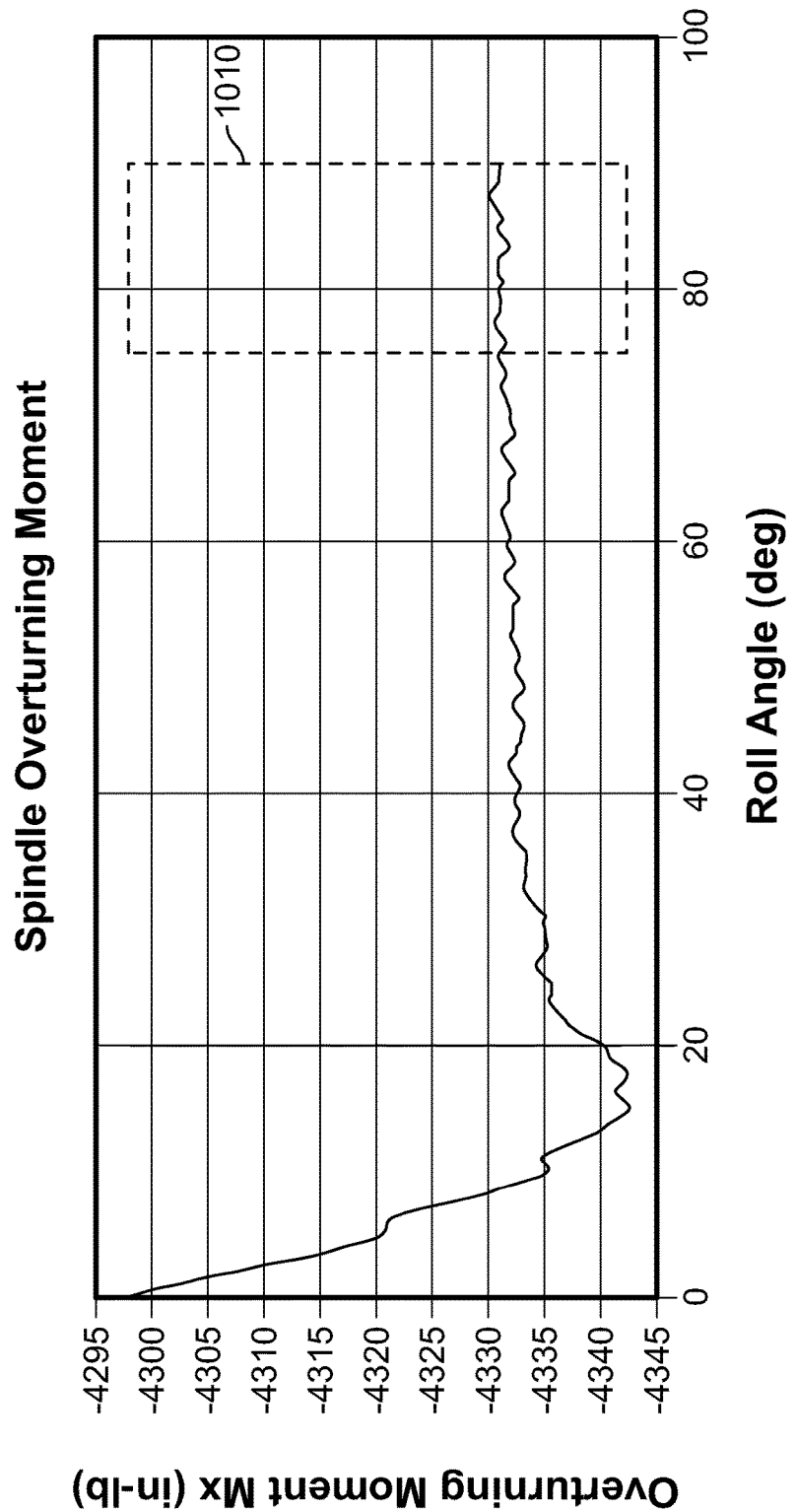
FIG. 10 illustrates an exemplary output of spindle overturning moment $M_x$ generated by FEA system 100 executing method 900.

As shown in FIG. 10, the value of the spindle overturning moment, denoted $M_x$, which corresponds to the torque of the tire about the X direction, converges to a steady state value in this example of about −4332 inch-pound after the modeled tire rolls approximately 75 degrees. The simulation continues until the tire has rolled about 90 degrees. In order to determine a single representative value of the steady-state condition reached by the tire simulation, the values of the overturning moment may then be averaged over the region of interest 1010, which corresponds to the tire revolution between about 75 and 90 degrees.

Figure 11:
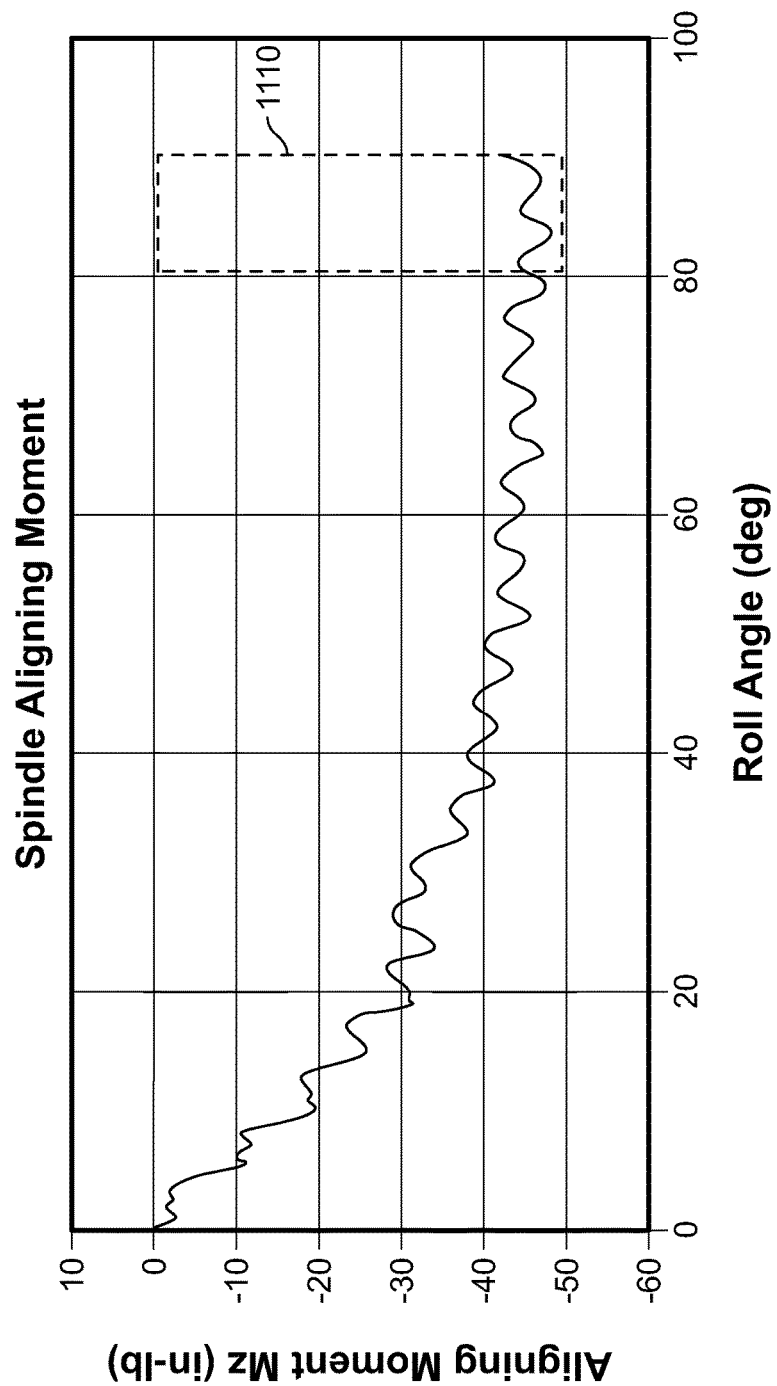
FIG. 11 illustrates an exemplary output of spindle aligning moment $M_x$ generated by FEA system 100 executing method 900.
Figure 12:
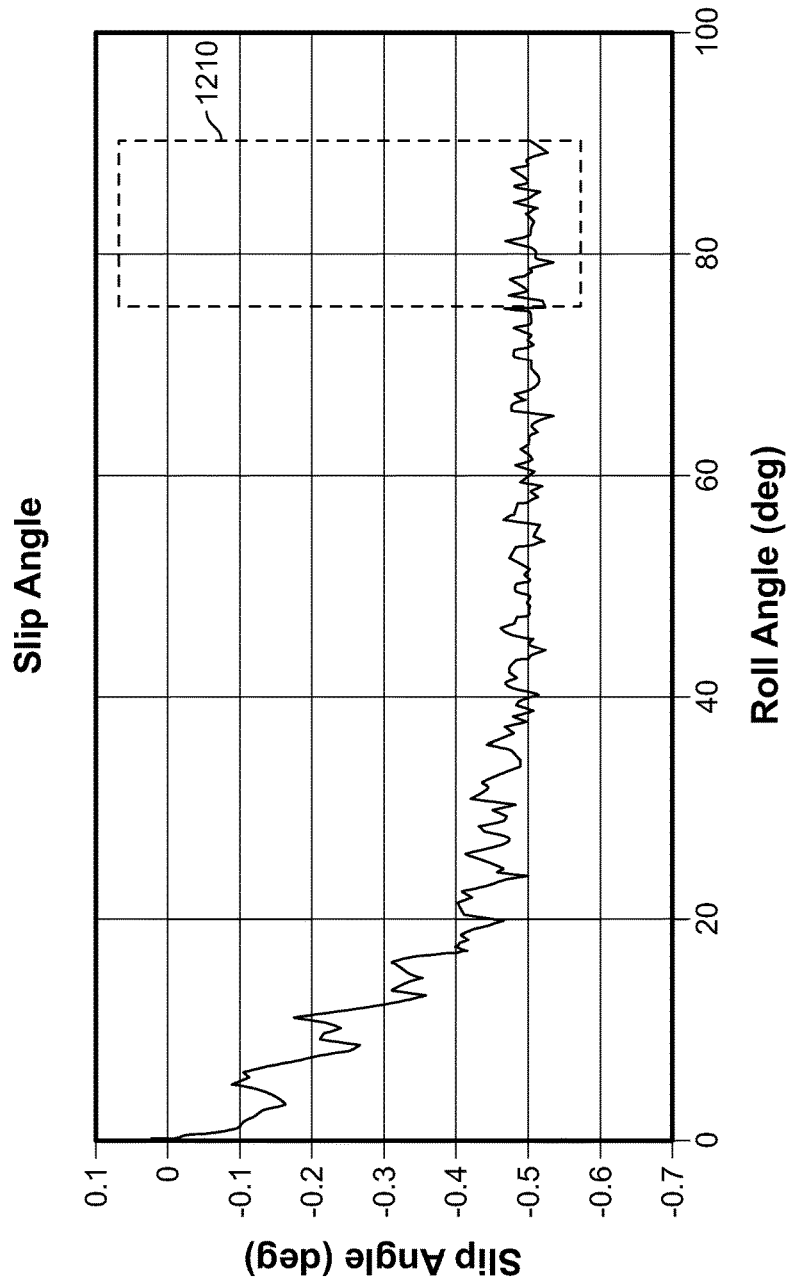
FIG. 12 illustrates an exemplary output of slip angle α generated by FEA system 100 executing method 900.

Criteria may be set to determine whether values of dependent parameters have sufficiently converged to be considered to have reached a steady state. Satisfaction of the criteria may indicate acceptable ranges over which a region of interest may be chosen. The simulation may generate dependent parameters that may be subject to the criteria include overturning moment $M_x$ as discussed above, or may include other parameters such as slip angle α, or spindle aligning moment $M_z$, which corresponds to the moment of the tire about the Z direction. FIG. 11 illustrates a graph of spindle aligning moment $M_z$ at roll angles of between about 0 and 90 degrees. An average value of $M_z$ taken in region of interest 1110, selected to span between about 80 and 90 degrees of roll angle, gives an average value of −47 inch-pounds for $M_z$. FIG. 12 illustrates a graph of slip angle α at roll angles of between about 0 and 90 degrees. An average value of the slip angle is taken in region of interest 1210, selected to span between about 75 and 90 degrees of roll angle, gives an average value of −0.5 degrees of slip angle. Such graphs may be produced by FEA system 100 after performing method 900. Alternatively, the values of the dependent variables may be stored to computer readable medium 104, or stored at a remote network storage location through network controller 114.

The criteria for achieving steady state values of one or more dependent variables may be preselected. Such criteria may be set to include a requirement for a maximum change in the running average of one or more dependent variables per degree of rolling. Such an average may be taken over a window of, for example, the last 10 or 15 degrees of rolling. Higher or lower values for the width of the window may be selected. In one aspect of the present disclosure, selected values are multiples of tread pitches or repeating tread block units. In another example, a criteria for convergence may be that the running average value of a dependent variable, such as the spindle aligning moment, over the last 10 degrees of roll angle is within 5 percent of the average value of the dependent variable over the preceding 10 degrees of rolling or that the standard deviation of the observed variable may be within an acceptable range. In other examples according to the present teachings, the running average value of a dependent variable over the last 10 degrees of roll angle is within 1 percent of the average value of the dependent variable over the preceding 10 degrees of rolling, or is within a certain preselected range of value. The FEA system 100 may be instructed to perform a simulation until the selected criteria for achieving a steady state solution are achieved.

In addition to the method 900, once a simulation is performed, a user may decide whether to adjust the tire model 200, or the parameters of the simulation, or both, and perform additional simulations with FEA system 100. The tire model may be adjusted by adding or subtracting sections of tread to reduce the burden on computing resources of FEA system 100. For example, a section of tire tread may be increased from 60 degrees to any value between about 60 and 360 degrees of angular circumferential length. In addition, the form of the tire tread, if any, may be adjusted. Many other parameters may also be adjusted, and will typically be adjustable through an FEA software package installed upon the computer readable medium 104 of FEA system 100.

Such changes may be input by a user through user interface 106. In the event a simulation does not achieve a steady state condition for a dependent variable, process 900 may be performed again with a longer total rolling distance. Changing the total angular rolling distance for a simulation may require increasing the circumferential length of tire 200 in the model in addition to continuing the simulation for a longer period. Increasing the distance the simulated tire rolls permits the region of interest 1010 to extend to greater roll angles of the simulated tire 200.

The information provided by FEA system 100 and the exemplary method 900 described herein allows a user to efficiently determine steady state behavior of the dependent variables generated under conditions applied to the simulated tire 200 of the FEA simulation. The user may determine that the resulting values of the dependent variables are undesirable. As a result, the user is able to change the tire model, and perform method 900 on the altered model in order to determine whether the characteristics of the modeled tire are improved. Such simulations and alterations to the tire model may be performed iteratively to determine an optimum tire design.

It will be appreciated that the teachings described herein and illustrated in the drawings represent a few of the many ways of implementing and applying finite element analysis to calculate dependent variables while maintaining forces applied by the road 202 or drum 600 on the tire 200 according to the present teachings. The methods described and illustrated in the present disclosure may be modified in any manner that accomplishes the functions described herein. It is to be understood that the methods and apparatuses described herein may be distributed in any manner among any quantity (e.g., one or more) of hardware and/or software modules or units, computer or processing systems or circuitry.

Software for implementing the methods disclosed herein may be integrated within a stand-alone computer system or may execute separately and be coupled to any number of devices, workstation computers, server computers or data storage devices via any communications medium (e.g., network, modem, direct connection, etc.). The processes described herein may be implemented by any quantity of devices and/or any quantity of personal or other type of devices, computers or processing system (e.g., desktop, laptop or server computers). The FEA system 100 may include any commercially available operating system (e.g., Windows, Mac Lion, Unix, Linux, etc.), any commercially available and/or custom FEA software (e.g., Abaqus, NASTRAN, LS-DYNA or custom written software) and any types of input and/or output devices (e.g., keyboard, mouse, displays, printers, etc.).

It is to be understood that the software having instructions for implementing the processes described herein may be implemented in any desired computer language. For example, in one exemplary embodiment, the processes disclosed herein can be written using the Python programming language, however, the present disclosure is not limited to being implemented in any specific programming language. The various instructions and data sets may be stored in any quantity or types of file, data or database structures. Moreover, the software for performing the steps described herein may be distributed on any suitable medium (e.g., stored on devices such as CD-ROM and diskette, downloaded from the Internet or other network (e.g., via packets and/or carrier signals), downloaded from a bulletin board (e.g., via carrier signals), or other conventional distribution mechanisms).

The software for implementing the methods described herein may be installed and executed on a computer system in any conventional or other manner (e.g., an install program, copying files, entering an execute command, etc.). The functions associated with an FEA system 100 that performs the steps described herein may be performed on any quantity of computers or other processing systems. Further, the specific functions may be assigned to one or more of the computer systems in any desired fashion.

Further, any references herein of software performing various functions generally refer to computer systems or processors performing those functions under software control. The computer system may alternatively be implemented by hardware or other processing circuitry. The various functions of the methods described herein may be distributed in any manner among any quantity (e.g., one or more) of hardware and/or software modules or units, computer or processing systems or circuitry, where the computer or processing systems may be disposed locally or remotely of each other and communicate via any suitable communications medium (e.g., LAN, WAN, Intranet, Internet, hardwire, modem connection, wireless, etc.). The software and/or processes described above and illustrated in the flow charts and diagrams may be modified in any manner that accomplishes the functions described herein.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about A to B is intended to mean from about A to about B, where A and B are the specified values.

While the present disclosure illustrates various embodiments, and while these embodiments have been described in some detail, it is not the intention of the applicant to restrict or in any way limit the scope of the claimed invention to such detail. Additional advantages and modifications will be apparent to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

What is claimed is:

1. A method for making a tire with the aid of a finite element analysis system modeling a tire rotation, the method comprising:

inputting into the finite element analysis system data for a model tire having model tire parameters, at least a portion of a tread, and a spindle;

rolling the model tire against a tire contacting surface;

applying a constant force to the model tire at the tire contacting surface;

performing a finite element analysis simulation of the model tire rolling against the tire contacting surface rolling an angular distance of between about 60 degrees and 120 degrees while maintaining the force on the tire, wherein the finite element analysis system constantly monitors the model tire parameters and iteratively solves the tire conditions at each incremental time of the simulation while continuing to apply the force to the model tire on the tire contacting surface;

determining when the model tire parameters have reached a steady state value; and manufacturing a physical tire according to the model tire steady state parameters and conditions.

2. The method of claim 1, wherein the constant force comprises a constant loading force component and at least one of a constant lateral force component and constant transverse force component.

3. The method of claim 2, further comprising:

applying a camber to the model tire rolling against the tire contacting surface; and performing the finite element analysis simulation of the model tire rolling against the tire contacting surface while maintaining the camber and the force on the tire.

4. The method of claim 3, further comprising:

performing the finite element analysis simulation for a time sufficient to reach a steady state value for at least one of an overturning moment, aligning moment and slip angle.

5. The method of claim 1, further comprising:

applying a camber to the finite element model of a tire rolling against the tire contacting surface; and, performing the finite element analysis simulation of the model of a tire rolling against the tire contacting surface while maintaining the camber and the force on the tire.

6. The method of claim 5, further comprising performing the finite element analysis simulation for a time sufficient to reach a steady state value for at least one of an overturning moment, aligning moment and slip angle.

7. The method of claim 1, the performing the finite element analysis simulation step further comprising simulating a model of a tire rolling an angular distance of between about 80 degrees and 100 degrees.

8. The method of claim 1, wherein the finite element model of a tire has a tread pattern spanning an angular circumferential length of between about 60 to 270 degrees.

9. The method of claim 8, wherein the finite element model of a tire has a tread pattern spanning an angular circumferential length of between about 80 to 180 degrees.

10. The method of claim 1, further comprising: adjusting the finite element model of a tire based on a steady state value for at least one of an overturning moment, aligning moment and slip angle.

11. A method for manufacturing a tire, with the aid of a finite element analysis system modeling a tire rotation, the method comprising:

inputting into the finite element analysis system a model tire with model tire parameters, the model tire including a tread spanning an angular circumferential length of between about 60 to 180 degrees;

rolling the model tire against a tire contacting surface;

applying a constant loading force between the model tire and tire contacting surface;

applying at least one of a lateral force, a longitudinal force and a camber to the model tire at the tire contacting surface;

performing a finite element analysis simulation of the model tire rolling against the tire contacting surface, while maintaining the loading force and the at least one of the lateral force, the longitudinal force and the camber on the tire, wherein the finite element analysis system constantly monitors the model tire parameters, and iteratively solves tire conditions at each incremental time of the finite element analysis simulation while continuing to apply the constant loading force;

determining whether the dependent parameters have reached a steady state value; and making a physical tire according to the model of the tire at the steady state values.

12. The method of claim 11, further comprising:

performing the finite element analysis simulation for a time sufficient to reach a steady state value for at least one of an overturning moment, aligning moment and slip angle.

13. The method of claim 11, the performing the finite element analysis simulation step further comprises simulating a model of the tire rolling an angular distance of between about 60 degrees and 120 degrees.

14. The method of claim 13, the performing the finite element analysis simulation step further comprises simulating a model of the tire rolling an angular distance of between about 80 degrees and 100 degrees.

15. The method of claim 11, wherein the tire includes a tread spanning an angular circumferential length of between about 80 to 120 degrees.

16. An apparatus for modeling a rolling tire, comprising:

a computing device with one or more computer readable media configured to accept a finite element model of a model tire rolling against a tire contacting surface and having at least a portion of a tread, and at least one processor;

a user interface;

an output controller;

an input controller;

first instructions written upon the one or more computer readable media that upon execution by the at least one processor apply a force between the at least a portion of a tread and tire contacting surface;

second instructions written upon the one or more computer readable media that upon execution by the at least one processor perform a finite element analysis simulation of the model of the at least a portion of a tire rolling against the tire contacting surface, the tire rolling an angular distance of between about 60 degrees and 120 degrees while maintaining the force between the at least a portion of a tread and the tire contacting surface; and third instructions written upon the one or more computer readable media that upon execution by the at least one processor apply a camber to the at least a portion of a tire, wherein the second instructions written upon the one or more computer readable media that upon execution by the at least one processor perform the finite element analysis simulation of the model of a tire rolling against the tire contacting surface, maintain the camber on the tire, wherein the finite element analysis system constantly monitors the model tire parameters and iteratively solves the model tire conditions to determine when the model tire parameters have reached a steady state value; and manufacture an optimum tire design based upon the model tire parameters at steady state.

17. The apparatus of claim 16, wherein the first instructions written upon the one or more computer readable media apply a force between the at least a portion of a tread and tire contacting surface having a constant loading force component, and at least one of a constant lateral force component and constant transverse force component, upon execution by the at least one processor.

\* \* \* \* \*